United States Patent [19]

Myers

[11] Patent Number: 5,781,040

[45] Date of Patent: Jul. 14, 1998

[54] TRANSFORMER ISOLATED DRIVER FOR POWER TRANSISTOR USING FREQUENCY SWITCHING AS THE CONTROL SIGNAL

[75] Inventor: Richard C. Myers, McMinnville, Oreg.

[73] Assignee: Hewlett-Packard Company, Palo Alto, Calif.

[21] Appl. No.: 742,787

[22] Filed: Oct. 31, 1996

[51] Int. Cl.⁶ ........................................ H03K 7/38
[52] U.S. Cl. ............................ 327/44; 327/47; 327/109
[58] Field of Search .............................. 327/39, 40, 41, 327/42, 43, 44, 45, 46, 47, 48, 49, 108, 109, 365, 387

[56] References Cited

U.S. PATENT DOCUMENTS 5,469,098  11/1995  Johnson, Jr. .................... 327/108

Primary Examiner—Timothy P. Callahan
Assistant Examiner—Jeffrey Zweizig

[57] ABSTRACT

A driver for a power transistor (a MOSFET or IGBT) uses a transformer to isolate the power supply from the control signal, but uses very low power components on the isolated side to allow use of a physically small transformer. The control signal is one of two frequencies, and the isolated side of the driver includes a circuit for detecting which of the two frequencies is present. One frequency is preferably twice as much as the other. The output of the frequency detection circuit switches between low and high states depending on the frequency present, and the output of this circuit is connected to the input of a transistor driver circuit which charges the gate of the power transistor.

16 Claims, 2 Drawing Sheets

TRANSFORMER ISOLATED DRIVER FOR POWER TRANSISTOR USING FREQUENCY SWITCHING AS THE CONTROL SIGNAL

BACKGROUND OF THE INVENTION

1. Field of the Invention

The present invention generally relates to electrical circuits for providing power in a pulse mode, and more particularly to such a circuit having a single isolation transformer with very low power control circuits on the secondary that allow for a physically small isolation transformer. The invention has particular applicability in heart defibrillators.

2. Description of the Prior Art

Pulse mode driven power circuits are known, such as those which use a metal-oxide semiconducting, field-effect transistor (MOSFET) or an insulated gate bipolar transistor (IGBT), wherein the drain of the transistor is connected to a power supply, and the source of the transistor is connected to the output line of the device. In circuits where the power supplied is a particularly high voltage, such as in a heart defibrillator circuit which has a power supply in the thousands of volts, the power supply is preferably electrically isolated from the signal source which sets off the power pulse. Electric isolation of the patient from other circuitry is also a requirement of various agencies and standards groups (AAMI, FDA, IEC). This is conventionally accomplished, among other ways, using a transformer having a primary winding which is connected to the signal source, and switching circuitry that controls power transistor (the MOSFET or IGBT) is connected to the secondary winding of the transformer.

The switching circuitry, or power transistor driver, typically includes at least one other transistor, whether bipolar or field-effect, that switches the power transistor between on (conducting) and off (non-conducting) states by controlling the charge on the gate of the power transistor. One problem encountered in constructing such a circuit with an isolation transformer is the provision of a low voltage supply for the power transistor driver components such as the switching transistor. Low voltage power can be provided via current generated in the isolation transformer, but this can require a relatively large transformer. It is generally preferable to provide smaller components whenever possible, and this is particularly true, for example, with heart defibrillators which are often portable devices requiring minimum weight and space. It would, therefore, be desirable to devise a pulse mode driver for a power transistor which used very low power circuits on the isolated side so that a physically small (and less expensive) isolation transformer could be used. It would be further advantageous if the circuit still provided high transformer switching speeds, and matched switching times for series-connected power transistors to optimize voltage sharing between devices.

SUMMARY OF THE INVENTION

It is therefore one object of the present invention to provide a pulse mode driver for a power transistor.

It is another object of the present invention to provide a pulse mode driver which is electrically isolated by means of a small isolation transformer, and still generates sufficient voltage to power components on the isolated side of the circuit.

It is yet another object of the present invention to provide such an isolated, pulse mode driver which precisely matches on and off switching times in series-connected power transistors to guarantee voltage sharing between devices.

The foregoing objects are achieved in a pulse mode driver for a power transistor generally comprising an isolation transformer having a primary winding and a secondary winding, means connected to the primary winding for generating a control signal having either a first frequency or a second frequency, a frequency detection circuit connected to the secondary winding and having an output which is in a low state when the control signal is at the first frequency and which is in a high state when the control signal is at the second frequency, and a transistor driver circuit having an input connected to the output of the frequency detection circuit, and having an output which energizes the gate of the power transistor when the output of the frequency detection circuit is in the high state. The first frequency is preferably twice the second frequency, and the means for generating a control signal further comprises a clock input providing a signal at the first frequency, and a flip-flop acting as a divide-by-2 circuit to generating the second frequency based on a switch input signal.

Power for the frequency detection circuit and the transistor driver circuit may be provided by a voltage rectifier circuit which is connected to the secondary winding of the isolation transformer. Very low power components are used so that the power draws less than 3 mA, but the transistor driver circuit still generates sufficient voltage to charge the gate of the power transistor.

The frequency detection circuit may include an inverter generating a square-wave signal having either the first or the second frequency, based on said control signal, an integrator having an input connected to the inverter, a comparator having a reference input, and a control input connected to an output of the integrator, and a flip-flop having an input connected to an output of the comparator. The transistor driver circuit may include another comparator having a reference input, a control input connected to the output of the frequency detection circuit, acting as a voltage level shifter, and another transistor having a base connected to an output of the other comparator and having an emitter connected to the gate of the power transistor.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DESCRIPTION OF THE PREFERRED EMBODIMENT

Figure 1:
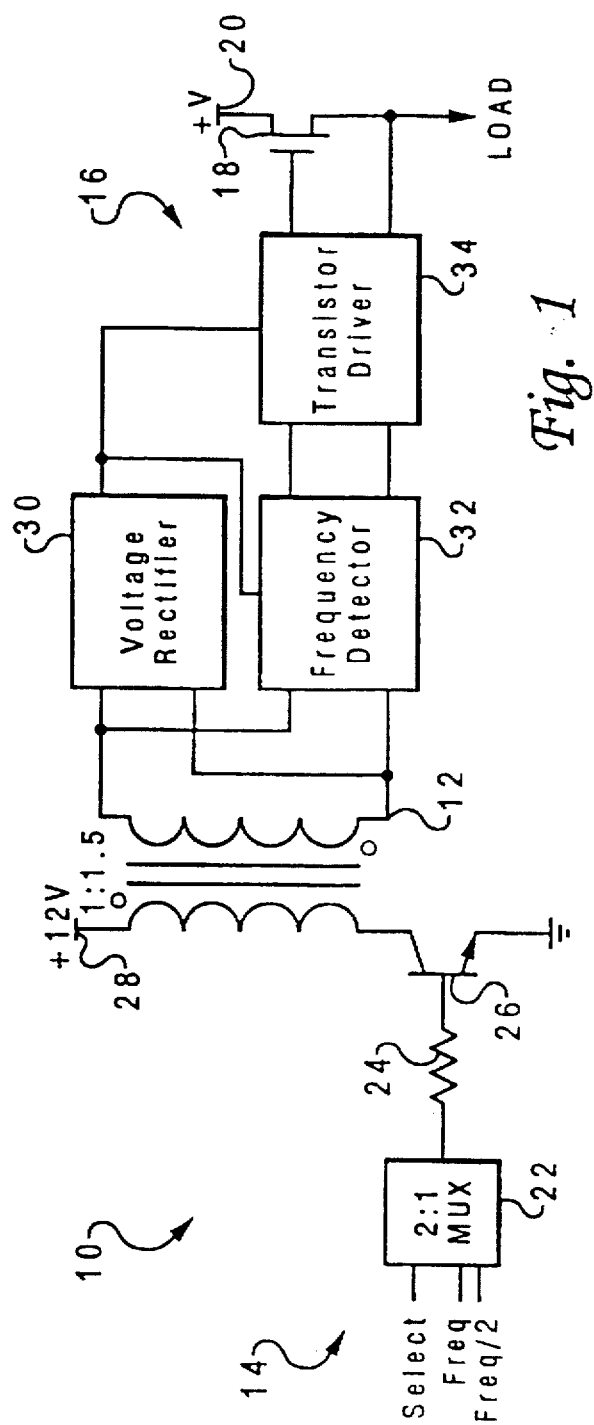
FIG. 1 is a block diagram of the power transistor driver of the present invention.

With reference now to the figures, and in particular with reference to FIG. 1, there is depicted the power transistor driver 10 of the present invention. Power transistor driver 10 is generally comprised of a transformer 12 having a primary winding connected to a grounded circuit 14, and a secondary winding connected to an isolated circuit 16. The output of the isolated circuit is connected to a power transistor 18, such as a MOSFET or IGBT, whose drain is connected to a power supply 20, and whose source is the output of driver 10. In the case of a defibrillator, the source of power transistor 18 is connected to the electrode to be applied to the heart attack victim. A high voltage pulse is generated at the electrode upon receipt of a control signal by grounded circuit 14.

Driver 10 uses transformer 12 to couple the signal as well as power to the components in isolated circuit 16. The present invention uses frequency switching, or shifting, as the control signal. A 2:1 multiplexer 22 selects between driving isolation transformer 12 at one of two frequencies, Freq or Freq/2. The output of multiplexer 22 passes through resistor 24 to the base of a transistor 26. The emitter of transistor 26 is connected to ground, and the collector is connected to the primary winding of transformer 12, which is further connected to a low power (e.g., 12 volt) supply 28. The secondary winding of transformer 12 is thus energized at the output frequency of multiplexer 22.

A voltage rectifier 30 on the secondary is used to generate isolated power. This supply is used to power a frequency detector circuit 32 and a transistor driver circuit 34. Frequency detect circuit 32 discriminates between Freq and Freq/2, and its output is transmitted to transistor driver circuit 34 synchronous with a clock edge. Voltage rectifier 30, frequency detector circuit 32 and transistor driver circuit 34 all use low power components that allow for a physically small (and less expensive) isolation transformer 12.

Figure 2:
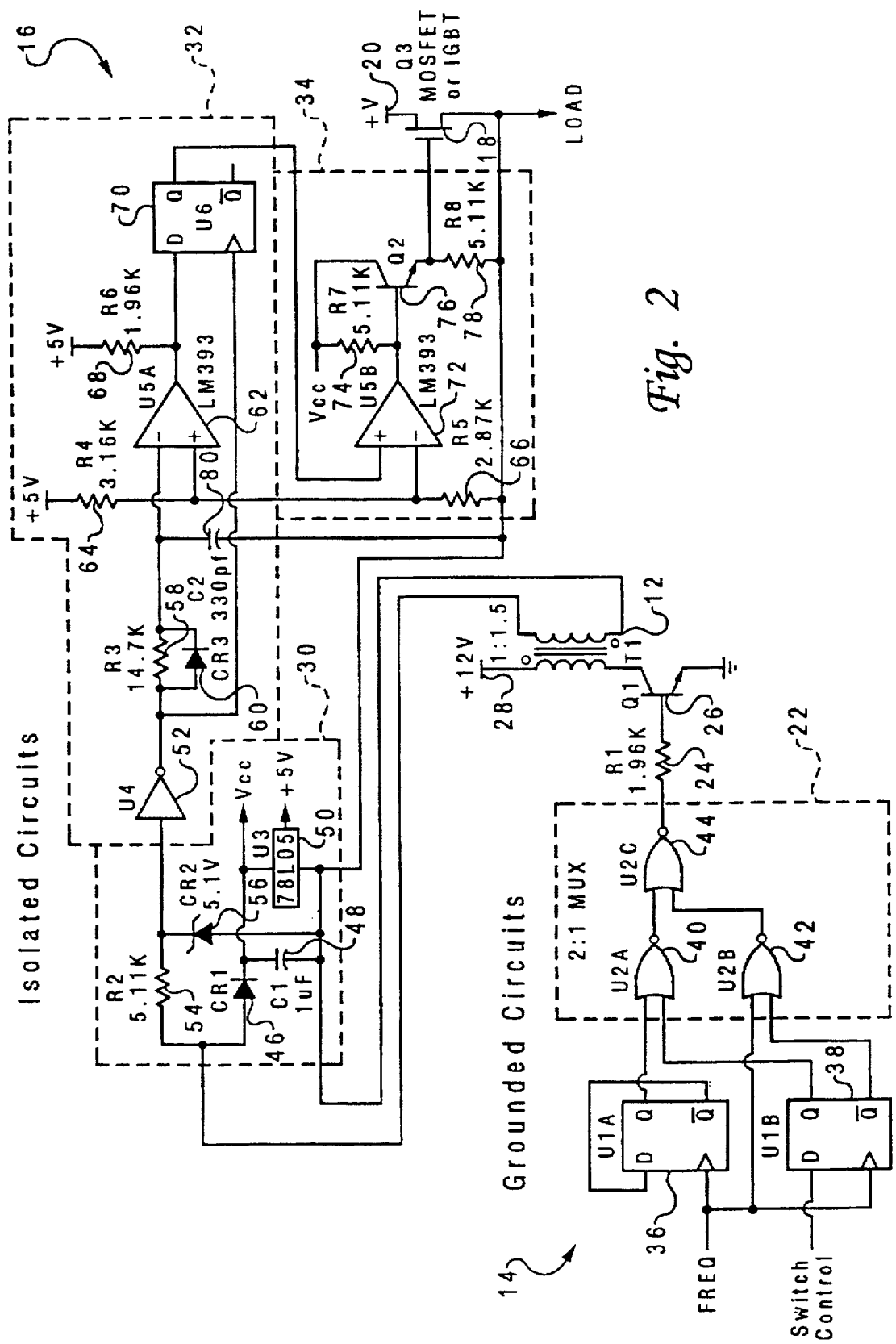
FIG. 2 is a schematic diagram of power transistor driver of FIG. 1.

Circuit operation can best be understood with further reference to FIG. 2, which shows the components in one preferred embodiment of the invention. Multiplexer 22 includes two flip-flops 36 and 38, and gates 40, 42 and 44. Flip-flop 36 is configured as a divide-by-2 circuit, with the output Q connected to one input of gate 40. From a master clock input, this allows the generation of Freq and Freq/2. Flip-flop 38 is used to synchronize the switch control input signal with the clock signal. Its outputs Q and Q are connected to one input each of gates 40 and 42. The other input of gate 42 is connected to the clock signal. Gates 40, 42 and 44 are NOR gates, configured as a 2:1 multiplexer. The output of this multiplexer switches between high and low states at either Freq or Freq/2, depending upon the input of the switch control signal, turning transistor 26 on and off at the corresponding frequency.

The secondary of transformer 12 is thereby energized at either Freq or Freq/2. Transformer 12 is configured in the flyback mode. A secondary voltage ($V_{cc}$) is developed using diode 46 and capacitor 48 as a rectifier. This output voltage is a function of the transformer turns ratio, input voltage, and duty cycle. Output voltage is not critical, so long as sufficient gate voltage is developed to turn on power transistor 18 (10 to 20 volts is adequate). A regulated 5 volt supply is generated using an LM78L05 chip 50. Secondary current consumption is very low, kept under 3 mA, allowing for the very small isolation transformer.

Inverter 52 is used to buffer the secondary flyback signal. This buffer is powered by the regulated 5 volt supply, providing a clean signal as input to the frequency detect circuitry. Resistor 54 and zener diode 56 limit the voltage at the input of the buffer, protecting it from overvoltage conditions. The output of inverter 52 is connected in parallel with resistor 58 and diode 60 which are in turn connected to the negative input of comparator 62. The positive input is connected to the 5 volt reference via resistor 64, and to the secondary winding of transformer 12 via resistor 66. The output of comparator 62 is coupled with the 5 volt reference via another resistor 68 to the input of another flip-flop 70. Comparator 62 and flip-flop 70 form the basis of the frequency detector. The other input of flip-flop 70 is connected to the output of inverter 52.

The output Q of flip-flop 70 is connected to the positive input of another comparator 72. Its negative input is connected to the 5 volt reference via resistor 64, and to the secondary winding of transformer 12 via resistor 66. Comparator 72 is used as a level shifter (5 volts to 15 volts). The output of comparator 72, which is coupled to $V_{cc}$ via resistor 74, drives the emitter follower of transistor 76, whose collector is also connected to $V_{cc}$. The output of transistor 76, which is connected to the secondary winding of transformer 12 via another resistor 78, then drives power transistor 20.

Figure 3:
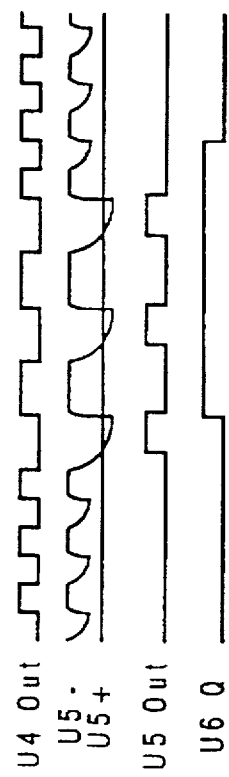
FIG. 3 is a timing diagram depicting input voltages and output states of various components in the circuitry of FIG. 2.

The timing diagram of FIG. 3 is useful in understanding the operation of isolation circuit 16. The output of inverter 52 feeds the simple integrator formed from resistor 58, diode 60 and a capacitor 80 which is connected to the negative input of comparator 62 and to the secondary winding of transformer 12. This circuit has a fast rise time as capacitor 80 is charged through diode 60, and a slow fall time as capacitor discharges through resistor 58. The output of this integrator is compared with a reference potential by comparator 62. As seen in the timing diagram, the output of comparator 62 will pulse high as the frequency at inverter 52 drops to Freq/2. This signal is then latched by flip-flop 70 on the rising edge of the signal from inverter 52. The output of flip-flop 70 remains high until the frequency at inverter 52 returns to Freq and the output of comparator 62 stops pulsing. Driving power transistor 18 synchronously with a clock edge imparts the ability to match switching times very precisely. This ability is particularly useful for series-connected power transistors such as are used in defibrillators.

The specific types of components used and their characteristics may vary depending upon the particular application. For defibrillators, the on state of power transistor 18 (i.e., the pulse period for the signal from the output of flip-flop 70) should last at least 10 ms, and preferably lasts about 15 ms. This period may be provided by using a clock having a frequency of 200 kHz (Freq), a switch control signal lasting about 2-20 ms (a biphasic or monophasic truncated waveform). The minimum pulse width for this exemplary circuit is one cycle of Freq/2, or 10 μs.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is therefore contemplated that such modifications can be made without departing from the spirit or scope of the present invention as defined in the appended claims.

I claim:

1. A pulse mode driver for switching a power transistor between conducting and non-conducting states, comprising:

means for generating a control signal having either a first frequency or a second frequency;

means for generating a clock edge signal based on said control signal;

transistor means for selectively charging the gate of the power transistor in response to said clock edge signal; and means for electrically isolating said control signal generating means from said clock edge signal generating means, and for providing power to said transistor means and said clock edge signal generating means.

2. The pulse mode driver of claim 1 wherein said first frequency is approximately twice said second frequency, and said means for generating a control signal comprises:

clock means for providing a signal at said first frequency; and divider means for generating said second frequency based on a switch input signal.

3. The pulse mode driver of claim 1 wherein said power provided to said transistor means and said clock edge signal generating means draws less than 3 mA.

4. The pulse mode driver of claim 1 wherein said isolating means comprises a transformer having a primary winding and a secondary winding, said primary winding being connected to said means for generating said control signal, and said secondary winding being connected to said means for generating said clock edge signal.

5. The pulse mode driver of claim 1 wherein said means for generating said clock edge signal includes:

an inverter generating a square-wave signal having either said first or said second frequency, based on said control signal;

an integrator having an input connected to said inverter;

comparator having a reference input, and a control input connected to an output of said integrator; and a flip-flop having an input connected to an output of said comparator.

6. The pulse mode driver of claim 1 wherein said means for generating said clock edge signal includes:

means for detecting whether said control signal is at said first frequency or said second frequency;

latch means for energizing said transistor means when said control signal is at said second frequency; and means, connected to said detecting means and said latch means, for rectifying power supplied by said isolating means.

7. The pulse mode driver of claim 3 wherein said transistor means charges the gate of the power transistor to at least 10 volts.

8. The pulse mode driver of claim 5 wherein said integrator includes:

a resistor;

a diode connected in parallel with said resistor to said control input of said comparator; and a capacitor connected to said control input of said comparator such that said integrator has a fast rise time as said capacitor is charged through said diode, and a slow fall time as said capacitor discharges through said resistor.

9. The pulse mode driver of claim 6 wherein:

said frequency detecting means includes at least one comparator having a reference signal input and a control signal input; and said latch means includes at least one flip-flop having an input connected to an output of said comparator.

10. A device for providing pulsed electrical power, comprising:

an isolation transformer having a primary winding and a secondary winding;

means, connected to said primary winding, for generating a control signal having either a first frequency or a second frequency;

a power supply;

a power transistor having a gate, a source adapted to be connected to an external electrode, and a drain connected to said power supply;

a frequency detection circuit, connected to said secondary winding, having an output which is in a low state when said control signal is at said first frequency and which is in a high state when said control signal is at said second frequency;

a transistor driver circuit having an input connected to said output of said frequency detection circuit, and having an output which energizes said gate of said power transistor when said output of said frequency detection circuit is in said high state; and a voltage rectifier circuit, connected to said secondary winding, for providing power to said frequency detection circuit and said transistor driver circuit.

11. The device of claim 10 wherein said first frequency is approximately twice said second frequency, and said means for generating a control signal comprises:

clock means for providing a signal at said first frequency; and divider means for generating said second frequency based on a switch input signal.

12. The device of claim 10 wherein:

said power provided by said voltage rectifier circuit to said frequency detection circuit and said transistor driver circuit draws less than 3 mA; and said transistor driver circuit charges said gate of said power transistor to at least 10 volts.

13. The device of claim 10 wherein said frequency detection circuit includes:

an inverter generating a square-wave signal having either said first or said second frequency, based on said control signal;

an integrator having an input connected to said inverter;

a comparator having a reference input, and a control input connected to an output of said integrator; and a flip-flop having an input connected to an output of said comparator.

14. The device of claim 10 wherein said transistor driver circuit includes:

a comparator having a reference input, a control input connected to said output of said frequency detection circuit, and acting as a voltage level shifter; and a transistor having a base connected to an output of said comparator and having an emitter connected to said gate of said power transistor.

15. The device of claim 13 wherein said comparator is a first comparator, and said transistor driver circuit includes:

a second comparator acting as a voltage level shifter having a reference input, and a control input connected to said output of said frequency detection circuit; and a transistor having a base connected to an output of said second comparator and having an emitter connected to said gate of said power transistor.

16. The device of claim 13 wherein said integrator includes:

a resistor;

a diode connected in parallel with said resistor to said control input of said comparator; and a capacitor connected to said control input of said comparator such that said integrator has a fast rise time as said capacitor is charged through said diode, and a slow fall time as said capacitor discharges through said resistor.

* * * * *